(12) United States Patent  
Horii

(10) Patent No.: US 12,075,582 B2  
(45) Date of Patent: Aug. 27, 2024

(54) ELECTRONIC APPARATUS AND DUMMY COVER

(71) Applicant: NEC Platforms, Ltd., Kawasaki (JP)

(72) Inventor: Yuji Horii, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 502 days.

(21) Appl. No.: 17/285,232

(22) PCT Filed: Oct. 15, 2019

(86) PCT No.: PCT/JP2019/040376  
§ 371 (c)(1),  
(2) Date: Apr. 14, 2021

(87) PCT Pub. No.: WO2020/095626  
PCT Pub. Date: May 14, 2020

(65) Prior Publication Data  
US 2021/0385960 A1    Dec. 9, 2021

(30) Foreign Application Priority Data

Nov. 9, 2018    (JP) .................................. 2018-211208

(51) Int. Cl.  
*H05K 7/14* (2006.01)  
*H05K 5/03* (2006.01)  
(Continued)

(52) U.S. Cl.  
CPC ........... *H05K 5/03* (2013.01); *H05K 7/20145* (2013.01); *H05K 7/20736* (2013.01); *H05K 7/20136* (2013.01)

(58) Field of Classification Search  
CPC ...... H05K 5/0217; H05K 5/03; H05K 7/1424; H05K 7/1489; H05K 7/20; H05K 7/20136;  
(Continued)

(56) References Cited

U.S. PATENT DOCUMENTS 6,291,766 B1    9/2001    Komai  
7,269,006 B2 *  9/2007    Miyamoto ............. G11B 33/12  
                                                       361/679.48  
(Continued)

FOREIGN PATENT DOCUMENTS

JP    2001007573 A    1/2001  
JP    2003110261 A    4/2003  
(Continued)

OTHER PUBLICATIONS

Taiwanese Office Action for TW Application No. 108138575 mailed on Jan. 7, 2022 with English Translation.  
(Continued)

*Primary Examiner* — Adrian S Wilson  
*Assistant Examiner* — Gage Crum

(57) ABSTRACT

An electronic apparatus including a housing; a plurality of accommodating portions, formed in the housing, each having an opening portion that opens towards an outside of the housing; an electronic component unit having a unit body accommodated in at least one first accommodating portion among the plurality of accommodating portions, and a unit cover that is installed on the opening portion of the first accommodating portion and that has a first connection opening connecting an inside and an outside of the first accommodating portion; and a dummy cover that is installed on the opening portion of a second accommodating portion different from the first accommodating portion among the plurality of accommodating portions, and that has a second connection opening connecting an inside and an outside of the second accommodating portion.

2 Claims, 12 Drawing Sheets

(51) Int. Cl.
*H05K 7/20* (2006.01)
*H05K 9/00* (2006.01)

(58) Field of Classification Search
CPC .. H05K 7/20145; H05K 7/20736; G06F 1/20; H02B 2001/0155
See application file for complete search history.

(56) References Cited

U.S. PATENT DOCUMENTS

| | | | |
|---|---|---|---|
| 7,554,803 B2* | 6/2009 | Artman | H05K 7/20563 361/695 |
| 10,206,306 B2* | 2/2019 | Drake | H05K 7/18 |
| 2004/0252456 A1* | 12/2004 | Larson | H05K 7/20836 361/694 |
| 2005/0281014 A1* | 12/2005 | Carullo | H05K 7/1461 361/796 |
| 2017/0332507 A1 | 11/2017 | Adrian | |

FOREIGN PATENT DOCUMENTS

| | | | | |
|---|---|---|---|---|
| JP | 2010232305 A | 10/2010 | | |
| TW | 200829119 A | 7/2008 | | |
| TW | 201212798 A | 3/2012 | | |
| WO | 2013111340 A1 | 8/2013 | | |
| WO | WO-2013111340 A1 * | 8/2013 | | H05K 7/1425 |

OTHER PUBLICATIONS

International Search Report of PCT Application No. PCT/JP2019/040376 mailed Dec. 17, 2019.

* cited by examiner

ELECTRONIC APPARATUS AND DUMMY COVER

This application is a National Stage Entry of PCT/JP2019/040376 filed on Oct. 15, 2019, which claims priority from Japanese Patent Application 2018-211208 filed on Nov. 9, 2018, the contents of all of which are incorporated herein by reference, in their entirety.

TECHNICAL FIELD

The present invention relates to an electronic apparatus and a dummy cover.

BACKGROUND ART

Various electronic apparatuses, such as server apparatuses, are configured by incorporating multiple electronic components in a housing. Electronic components include those that generate large amounts of heat, and the heat must be dissipated inside the housing.

For example, Patent Document 1 describes a configuration in which outside air is guided into a housing to cool electronic components, and the outside air with an elevated temperature is discharged to the outside of the housing through ventilation holes.

PRIOR ART DOCUMENTS

Patent Documents

Patent Document 1

JP 2010-232305 A

SUMMARY OF INVENTION

Problems to be Solved by the Invention

There are apparatuses in which accommodating portions (recesses) that open towards the outside of a housing are provided in order to incorporate, into the housing, electronic components that are configured as units. These accommodating portions are referred to as slots or the like. By inserting and withdrawing electronic component units with respect to these accommodating portions, various electronic components can be incorporated into the housing as needed.

In the case of a housing provided with a plurality of such slots, slots in which units are incorporated may sometimes coexist with slots that remain empty, without units being incorporated therein (hereinafter referred to as empty slots). For example, if a fan is used to guide outside air for cooling into a housing, in a slot provided with such a fan and incorporating a unit, flow resistance due to the unit in the slot will cause the pressure of cooling air from the fan to increase. In contrast therewith, in an empty slot, there is little flow resistance, thereby lowering the pressure of the cooling air from the fan. The cooling air will tend to flow to areas with less resistance, i.e., to empty slots. For this reason, there are cases in which the amount of cooling air that is supplied becomes lower in slots incorporating units having electronic components that should be cooled.

As a response thereto, dummy covers for covering the opening portions of empty slots are sometimes installed on the opening portions. When a dummy cover is installed, cooling air is not discharged to the outside and the pressure in the empty slot becomes high. As a result thereof, the pressure balance in the housing is disrupted even in cases in which dummy covers are installed.

If the pressure balance of cooling air in a housing is disrupted due to such usage conditions, the cooling efficiency of electronic component units in the housing can sometimes be worsened.

An objective of the present invention is to solve the above-mentioned problem. In other words, an objective of the present invention is to provide an electronic apparatus and a dummy cover that solve the problem in which the cooling properties of electronic component units in a housing are reduced.

Means for Solving the Problems

The electronic apparatus of the present invention includes a housing; a plurality of accommodating portions, formed in the housing, each having an opening portion that opens towards an outside of the housing; an electronic component unit having a unit body accommodated in at least one first accommodating portion among the plurality of accommodating portions, and a unit cover that is installed on the opening portion of the first accommodating portion and that has a first connection opening connecting an inside and an outside of the first accommodating portion; and a dummy cover that is installed on the opening portion of a second accommodating portion different from the first accommodating portion among the plurality of accommodating portions, and that has a second connection opening connecting an inside and an outside of the second accommodating portion.

The dummy cover of the present invention is a dummy cover that can be installed on an opening portion of a second accommodating portion, among a plurality of accommodating portions formed in a housing of an electronic apparatus, that is different from a first accommodating portion in which an electronic component unit is incorporated, the dummy cover including a cover body that is installed on the opening portion; and a connection opening that is formed in the cover body and that connects an inside and an outside of the second accommodating portion.

Advantageous Effects of the Invention

The electronic apparatus and the dummy cover of the present invention allow the cooling properties of electronic component units inside a housing to be raised.

EXAMPLE EMBODIMENTS

Multiple embodiments of the present invention will be explained below with reference to the drawings. Regarding portions that are the same as those in one conventional example mentioned above in connection with the present embodiments, the same names will be used and detailed descriptions thereof will be omitted.

First Embodiment

Figure 1:
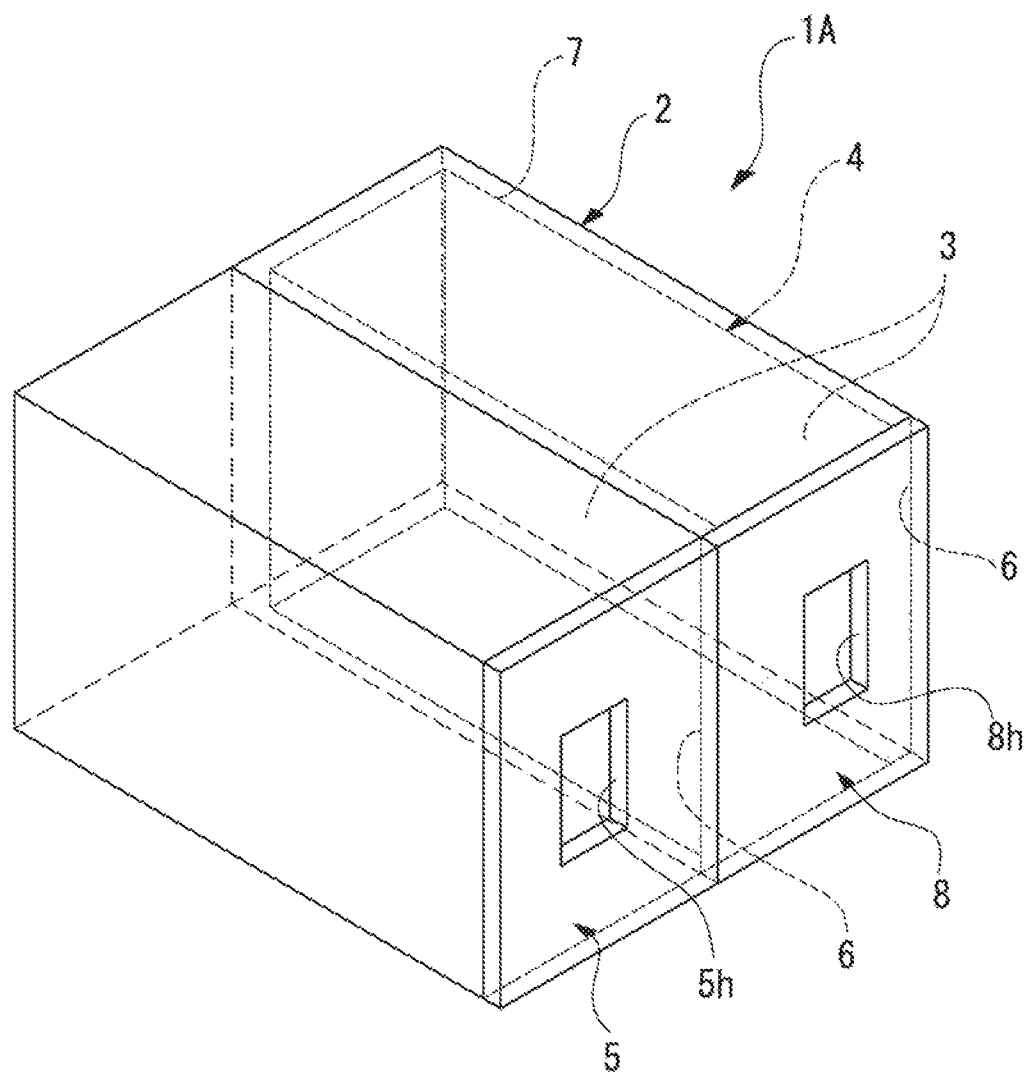
FIG. 1 is a perspective view illustrating a first embodiment, which is the minimum structure of the electronic apparatus.

FIG. 1 is a diagram illustrating the minimum structure of an electronic apparatus according to a first embodiment.

As illustrated in FIG. 1, the electronic apparatus 1A may be provided with at least a housing 2, a plurality of accommodating portions 3, an electronic component unit 4, and a dummy cover 5.

The housing 2 forms the outer frame of the electronic apparatus 1A.

The plurality of accommodating portions 3 are formed in the housing 2. Each accommodating portion 3 has an opening portion 6 that opens towards the outside of the housing 2.

The electronic component unit 4 is provided with a unit body 7 and a unit cover 8. The unit body 7 is accommodated in at least one of the plurality of accommodating portions 3. The unit cover 8 is installed on the opening portion 6. The unit cover 8 has a first connection opening 8h connecting the inside and the outside of the accommodating portion 3.

The dummy cover 5 is installed on an opening portion 6 of another accommodating portion 3 different from the accommodating portion 3 in which the electronic component unit 4 is accommodated. The dummy cover 5 has a second connection opening 5h connecting the inside and the outside of the accommodating portion 3.

In this electronic apparatus 1A, the electronic component unit 4 and the dummy cover 5 are installed in a plurality of accommodating portions 3 in the housing 2. In the accommodating portion 3 in which the electronic component unit 4 is installed, the heat inside the accommodating portion 3 is released to the outside through the first connection opening 8h formed in the unit cover 8. In the accommodating portion 3 on which the dummy cover 5 is installed, the heat in the accommodating portion 3 is released to the outside through the second connection opening 5h installed in the dummy cover 5.

In the accommodating portion 3 in which the electronic component unit 4 is installed, the only connection to the outside of the accommodating portion 3 is through the first connection opening 8h. Thus, the flow resistance to cooling air in the accommodating portion 3 rises. In the accommodating portion 3 in which the electronic component unit 4 is not installed, the dummy cover 5 can be installed on the opening portion 6 to raise the flow resistance in comparison with the case in which the dummy cover 5 is not installed. Additionally, by forming the second connection opening 5h in the dummy cover 5, the flow resistance can be suppressed so as not to become excessively high. In this way, the pressure balance can be improved between the accommodating portion 3 accommodating the electronic component unit 4 and the other accommodating portion 3 on which the dummy cover 5 is installed. Thus, decreases in the amount of cooling air supplied to the accommodating portion 3 in which the electronic component unit 4 is incorporated can be suppressed. As a result thereof, the cooling properties of the electronic component unit 4 in the housing 2 can be raised.

In the above-mentioned first embodiment, the housing 2 was illustrated, for example, as being box-shaped. However, the shape and configuration thereof may be any other shape or configuration.

Additionally, the unit body 7 of the electronic component unit 4 may have any configuration or use.

Furthermore, there is no intention to limit, in any way, the structure for fixing the unit cover 8 of the electronic component unit 4 or the dummy cover 5 to the opening portion 6, and various configurations may be employed.

Second Embodiment

Figure 2:
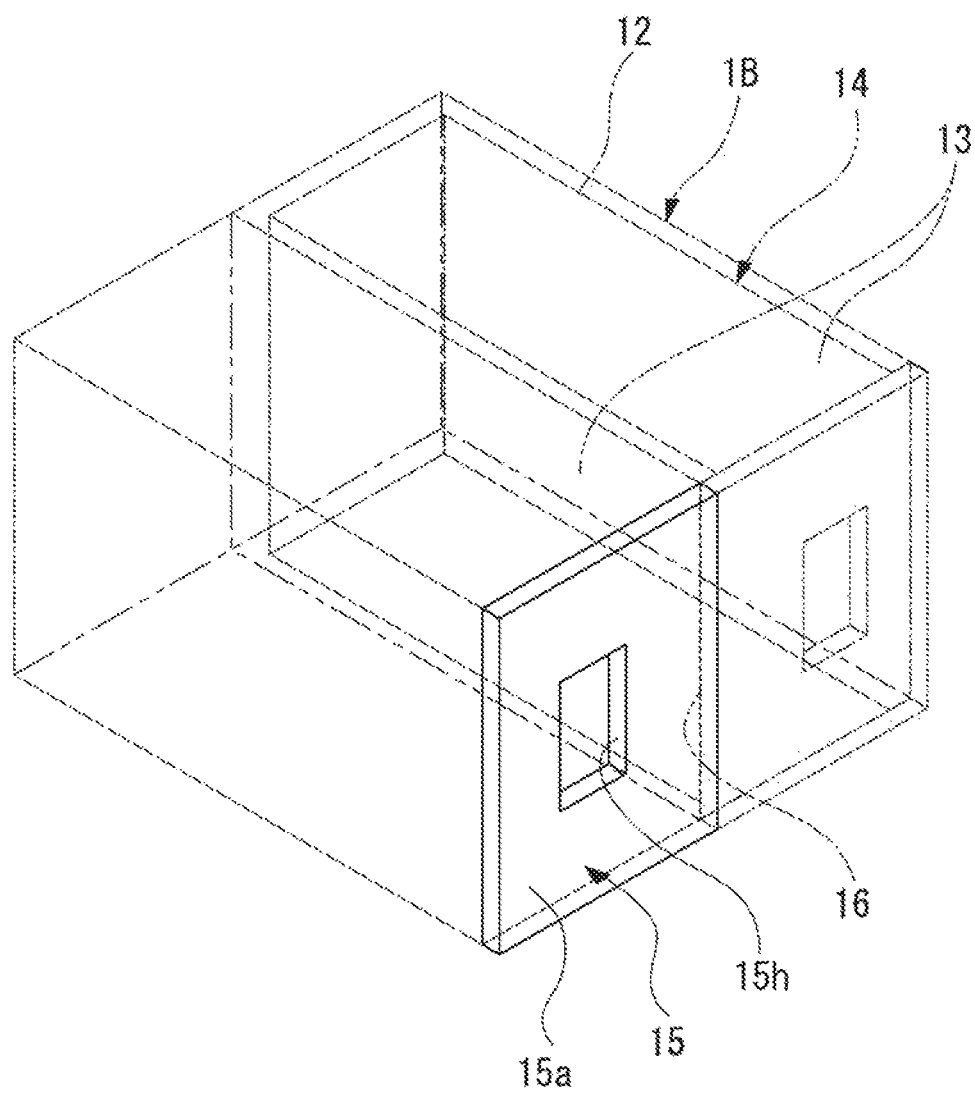
FIG. 2 is a perspective view illustrating a second embodiment, which is the minimum structure of the dummy cover.

FIG. 2 is a diagram illustrating the minimum structure of a dummy cover according to a second embodiment.

As illustrated in FIG. 2, the dummy cover 15 need only be provided with at least a cover body 15a and a connection opening 15h.

The dummy cover 15 can be installed on an opening portion 16 of another accommodating portion 13, among the plurality of accommodating portions 13 formed in the housing 12 of the electronic apparatus 1B, different from the accommodating portion 13 in which the electronic component unit 14 is incorporated.

The cover body 15a is installed on the opening portion 16. The connection opening 15h is formed in the cover body 15a. The connection opening 15h connects the inside and the outside of the accommodating portion 13.

This dummy cover 15, by being installed on the accommodating portion 13 in which the electronic component unit 14 is not installed, can raise the flow resistance of cooling air in the accommodating portion 13 in comparison with the case in which the dummy cover 15 is not installed. Additionally, by forming the connection opening 15h in the dummy cover 15, the flow resistance can be suppressed so as not to become excessively high. In this way, the pressure balance can be improved between the accommodating portion 13 accommodating the electronic component unit 14 and the other accommodating portion 13 on which the dummy cover 15 is installed. Thus, decreases in the amount of cooling air supplied to the accommodating portion 13 in which the electronic component unit 14 is incorporated can be suppressed. As a result thereof, the cooling properties of the electronic component unit 14 in the housing 12 can be increased.

In the above-mentioned second embodiment, the housing 12 was illustrated, for example, as being box-shaped. However, the shape and configuration thereof may be any other shape or configuration.

Additionally, the electronic component unit 14 may have any configuration or use.

Furthermore, there is no intention to limit, in any way, the structure for fixing the dummy cover 15 to the opening portion 16, and various configurations may be employed.

Third Embodiment

Figure 3:
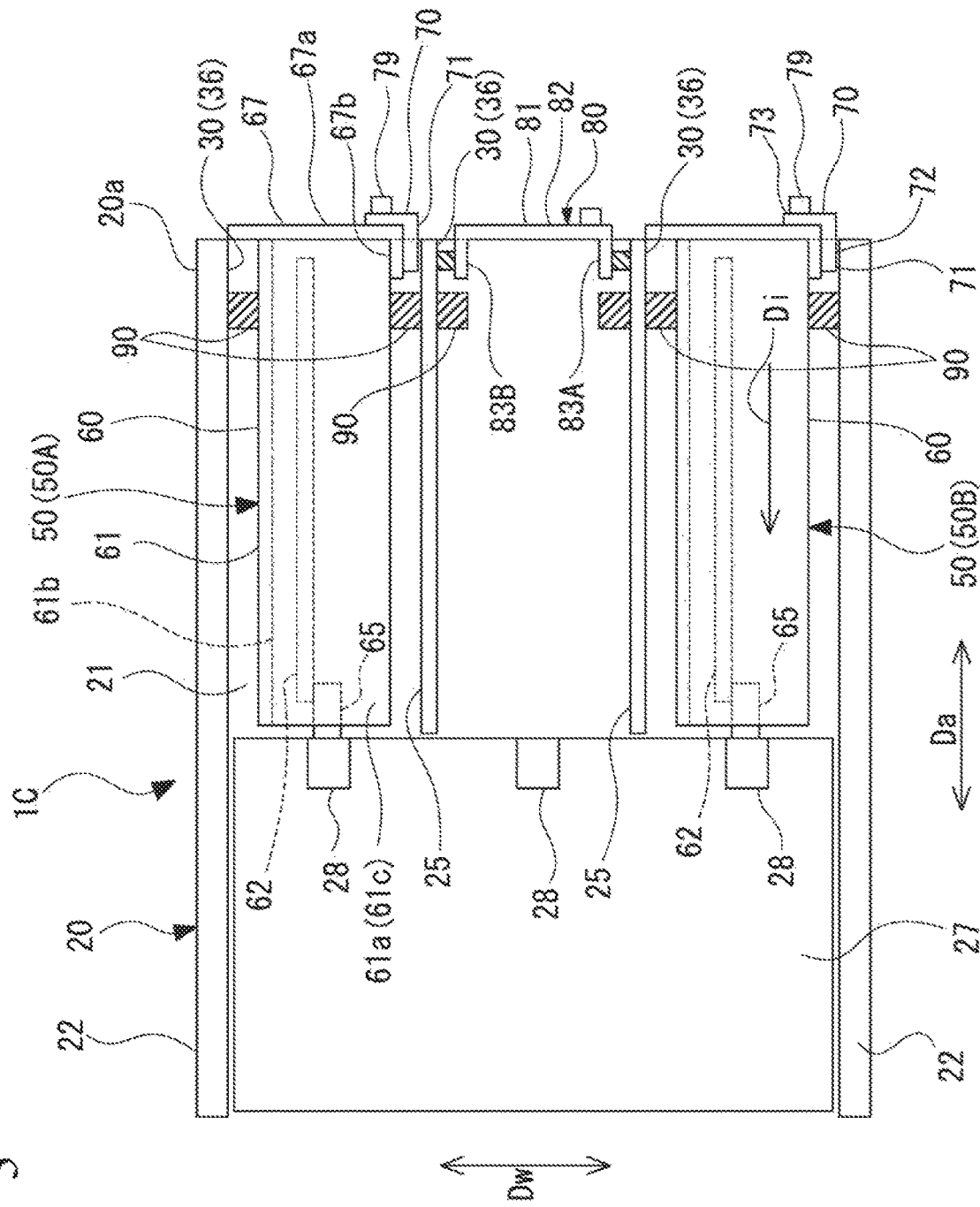
FIG. 3 is a plan view illustrating the structure of an electronic apparatus according to a third embodiment.
Figure 4:
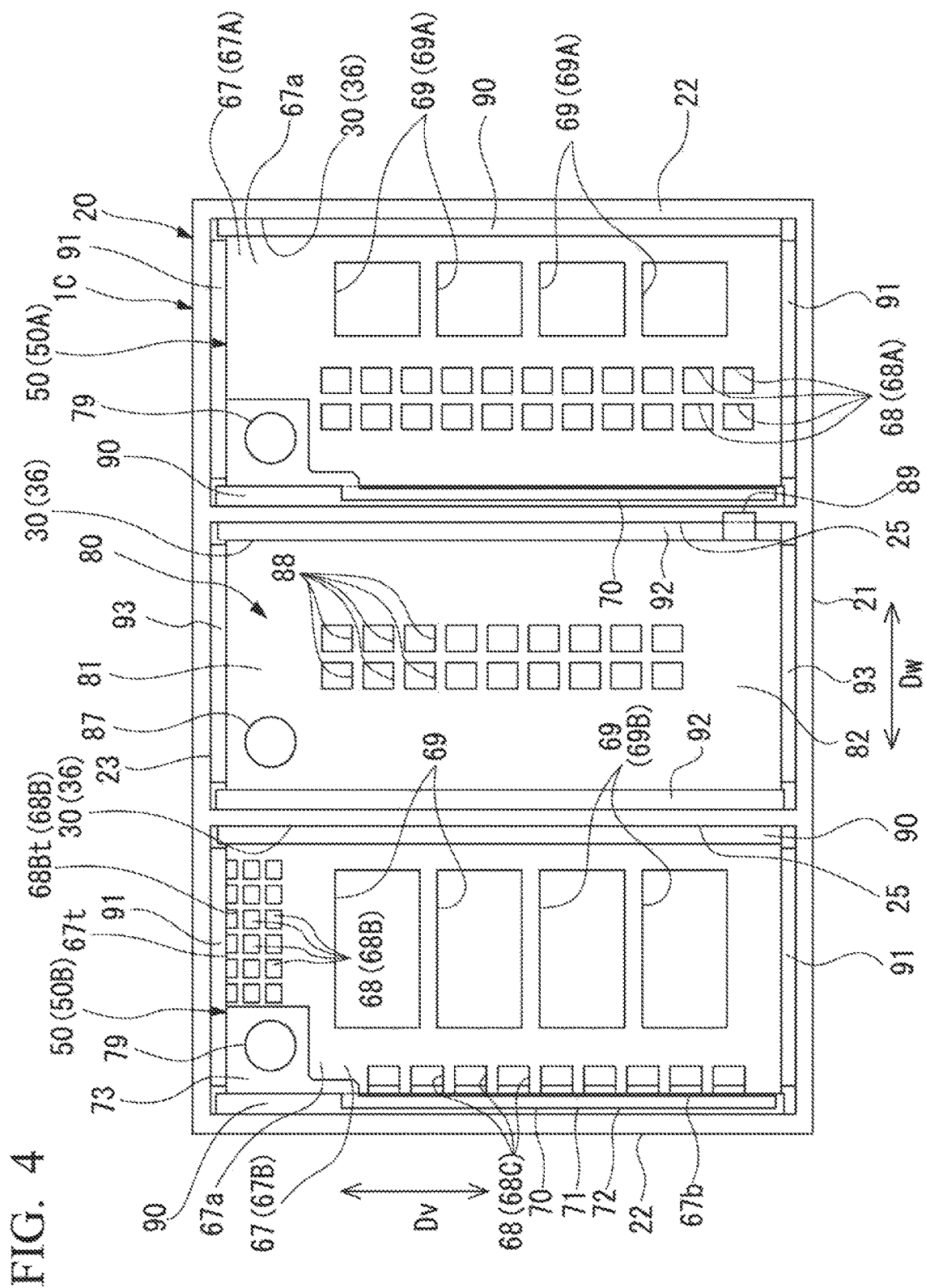
FIG. 4 is a rear view illustrating the electronic apparatus according to the third embodiment, viewed from the rear in the anterior-posterior direction.
Figure 5:
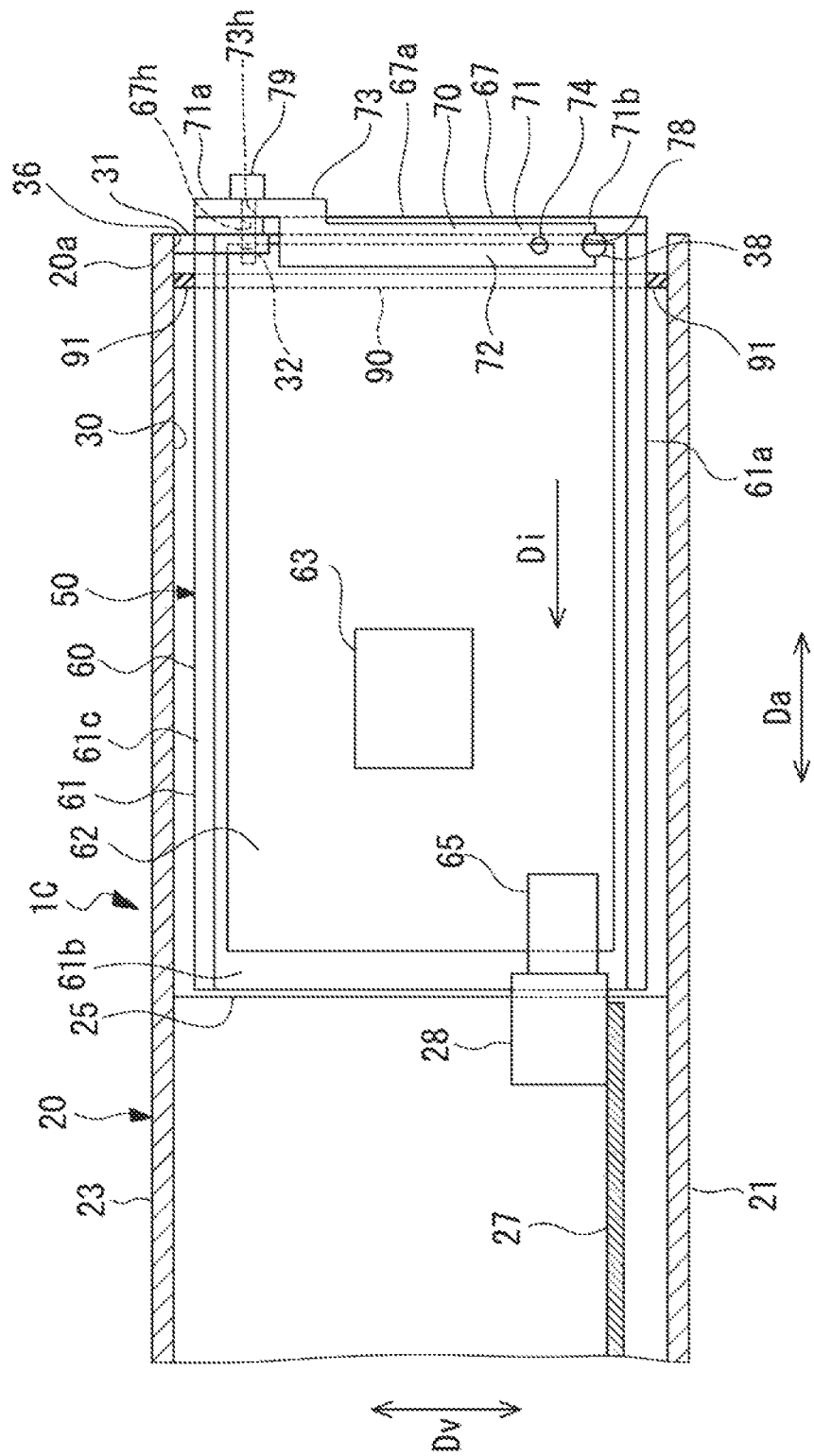
FIG. 5 is a side section view illustrating the electronic apparatus according to the third embodiment.

FIG. 3 is a plan view illustrating the structure of an electronic apparatus according to a third embodiment. FIG. 4 is a view of the electronic apparatus according to the third embodiment from the rear in the anterior-posterior direction. FIG. 5 is a side section view illustrating the electronic apparatus according to the third embodiment.

As illustrated in FIGS. 3 to 5, the electronic apparatus 1C of the third embodiment is provided with a housing 20, an electronic component unit 50, and a dummy cover 80.

The housing 20 forms the outer frame of the electronic apparatus 1C. The housing 20 is in the form of a hollow box, and accommodates various types of electronic components and the like in the interior thereof. The housing 20 is provided with a bottom plate 21, a pair of side plates 22, and an upper plate 23 (see FIG. 4 and FIG. 5).

In the description below, the direction in which the pair of side plates 22 face each other will be referred to as the width direction Dw, the direction orthogonal to the bottom plate 21 will be referred to as the vertical direction Dv, and the direction orthogonal to both the width direction Dw and the vertical direction Dv will be referred to as the anterior-posterior direction Da.

The bottom plate 21 forms the lower surface of the housing 20. The bottom plate 21 has a rectangular shape in plan view.

The pair of side plates 22 are provided on both sides of the housing 20 in the width direction Dw. The pair of side plates 22 are respectively provided so as to rise upward from both ends of the bottom plate 21 in the width direction Dw.

The upper plate 23 is provided at a distance, in the vertical direction Dv, from the bottom plate 21. The upper plate 23 is provided on the pair of side plates 22.

Figure 6:
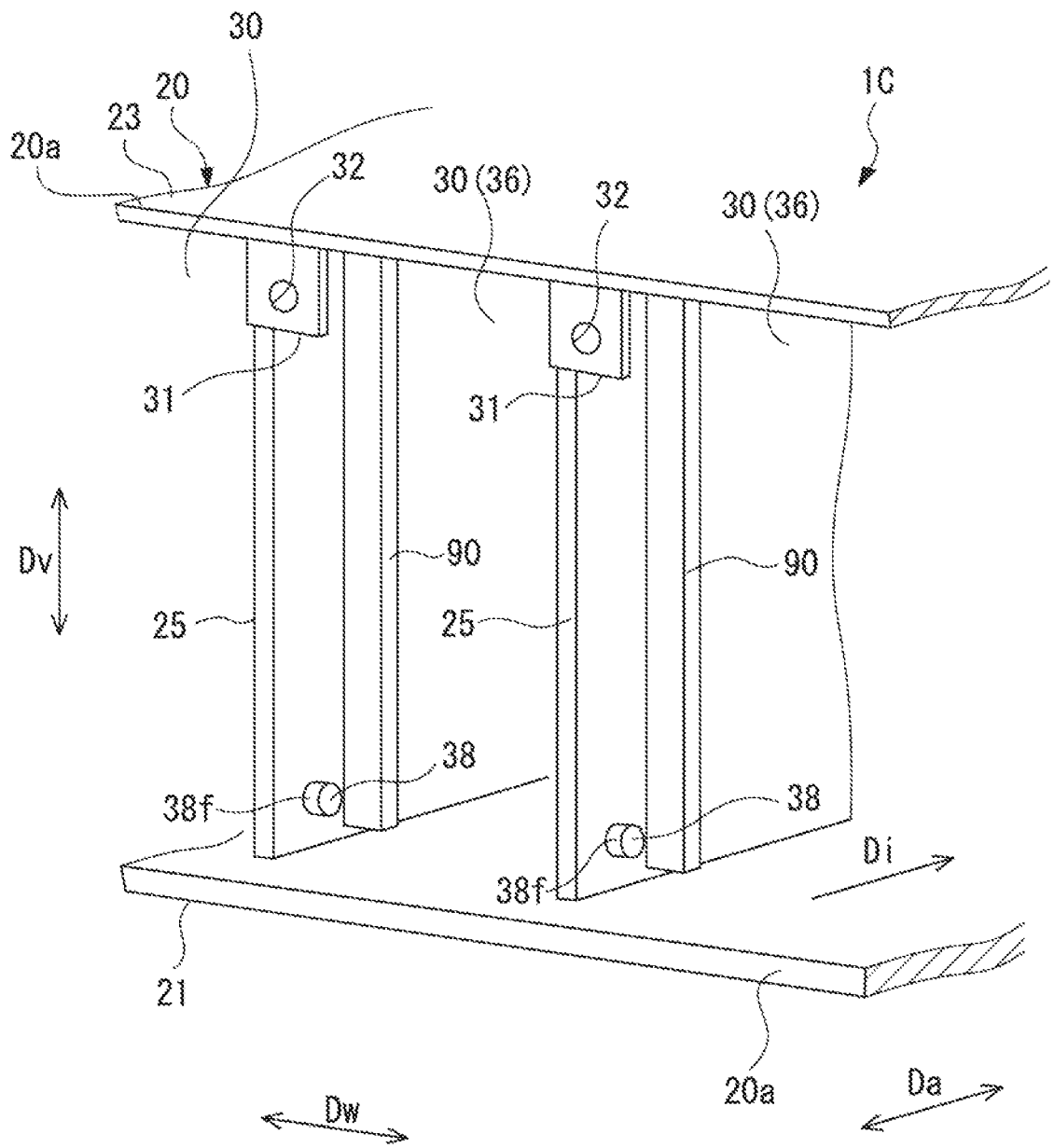
FIG. 6 is a perspective view illustrating a slot provided in a housing of the electronic apparatus according to the third embodiment.
Figure 7:
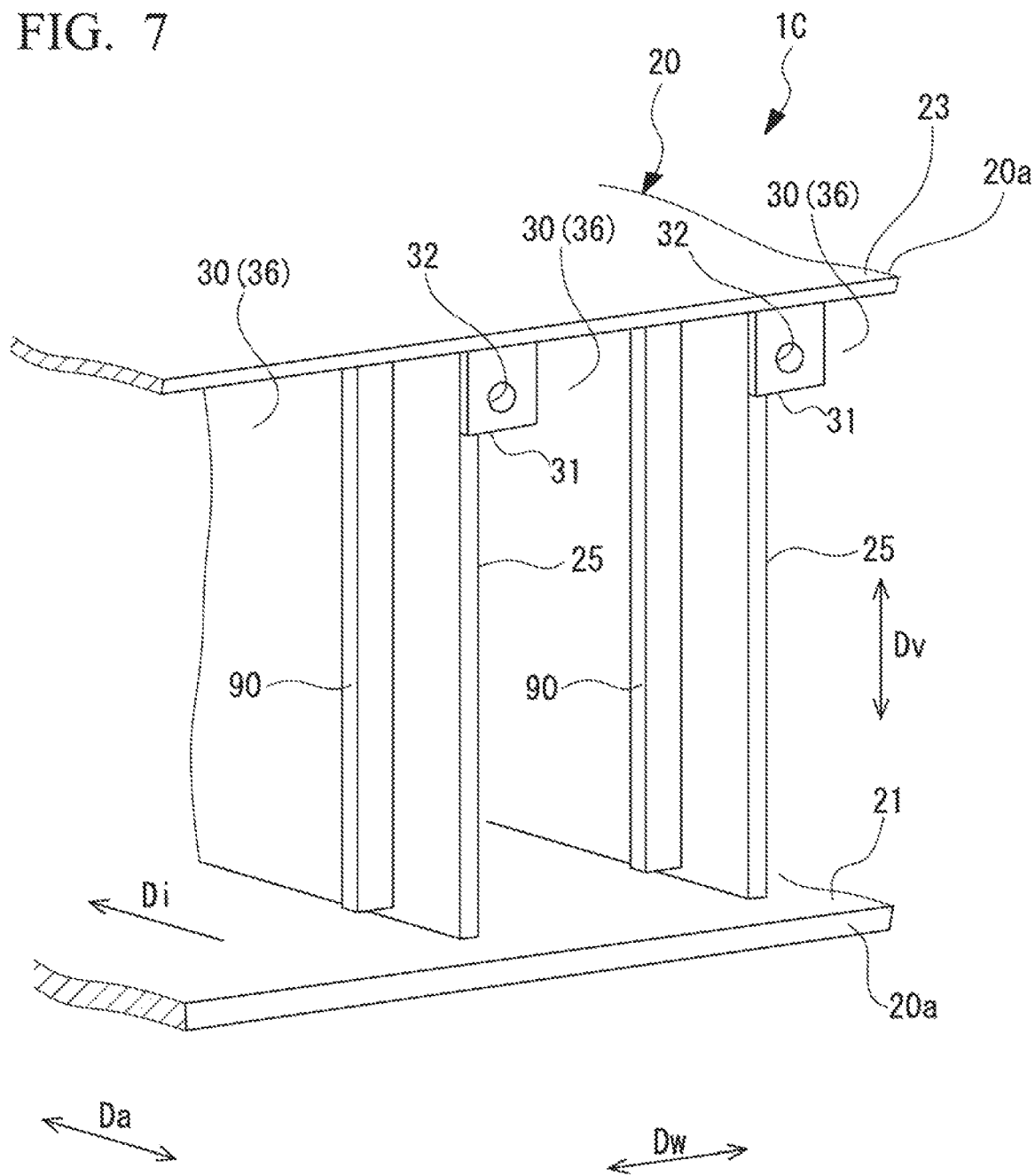
FIG. 7 is a perspective view of the slot provided in the housing of the electronic apparatus according to the third embodiment, viewed from a direction different from that in FIG. 6.

FIG. 6 is a perspective view illustrating a slot provided in the housing of the electronic apparatus according to the third embodiment. FIG. 7 is a perspective view of the slot provided in the housing of the electronic apparatus according to the third embodiment, viewed from a direction different from that in FIG. 6.

As illustrated in FIG. 3 to FIG. 7, the housing 20 has a plurality of slots (accommodating portions) 30 at one end portion 20a in the anterior-posterior direction Da. The plurality of slots 30 are provided so as to be arrayed in the width direction Dw. A plurality of partition walls 25 are provided on the end portion 20a of the housing 20 so as to be spaced in the width direction Dw. The partition walls 25 are in the form of panels that are arranged in vertical planes orthogonal to the width direction Dw. The partition walls 25 are connected, at the ends thereof in the vertical direction Dv, to the bottom plate 21 and the upper plate 23. The slots 30 are formed by being surrounded by the bottom plate 21 and the upper plate 23, and by partition walls 25 that are adjacent to each other in the width direction Dw, or by a side plate 22 and a partition wall 25. Each slot 30 is a cuboidal space.

Each slot 30 has an opening portion 36 that opens towards the outside of the housing 20. Each opening portion 36 opens towards one side in the anterior-posterior direction Da at the end portion 20a of the housing 20. In the third embodiment, the housing 20 is provided, for example, with three slots 30. However, the number of slots 30 provided in the housing 20 is not particularly limited. Additionally, multiple rows of slots 30 may be provided so as to be stacked in the vertical direction Dv.

In each slot 30, a seat portion 31 protruding inward into the slot 30 in the width direction Dw is formed on an upper portion of a partition wall 25 on one side in the width direction Dw (on the left in FIG. 6 and FIG. 7). The seat portion 31 is provided in a plane orthogonal to the anterior-posterior direction Da. A female screw portion 32 extending in the anterior-posterior direction Da is formed in the seat portion 31.

Engaging protrusions 38 are provided in the slots 30. The engaging protrusions 38 can engage with engaging levers 70 to be explained below. An engaging protrusion 38 is provided on the partition wall 25 on one side in the width direction Dw (on the left in FIG. 6) in each slot 30. The engaging protrusion 38 is provided so as to protrude inward into the slot 30 in the width direction Dw from the partition wall 25. The engaging protrusion 38 is cylindrical, with the axis in the width direction Dw, and has an outer circumferential surface 38f curved so as to have a circular circumference.

Thus, a slot 30 has an engaging protrusion 38 provided on the lower end (one end), in the vertical direction Dv, of an opening portion 36, and a female screw portion 32 provided on the upper end (other end), in the vertical direction Dv, of the opening portion 36.

As illustrated in FIG. 3 and FIG. 5, an electronic circuit board 27 is provided on the other side, in the anterior-posterior direction Da, with respect to each slot 30 in the housing 20. The electronic circuit board 27 is provided with a receiving connector 28 at a position corresponding to each slot 30. The receiving connector 28 is connected so as to be able to attach and detach an attachment connector 65 of a unit body 60 to be described below.

Electronic component units 50 or dummy covers 80 can be installed in the plurality of slots 30 provided in such a housing 20.

Figure 8:
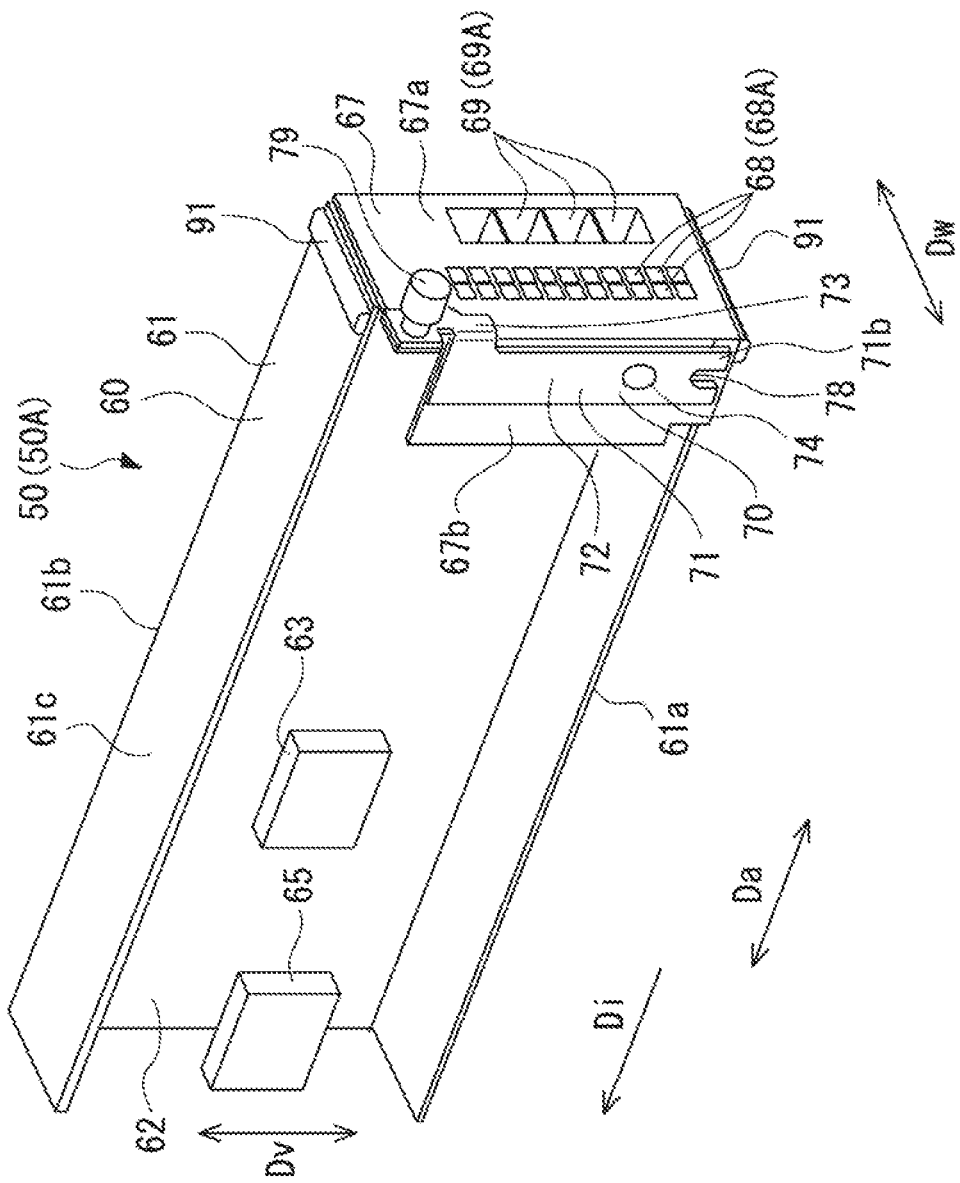
FIG. 8 is a perspective view illustrating an electronic component unit constituting the electronic apparatus according to the third embodiment.
Figure 9:
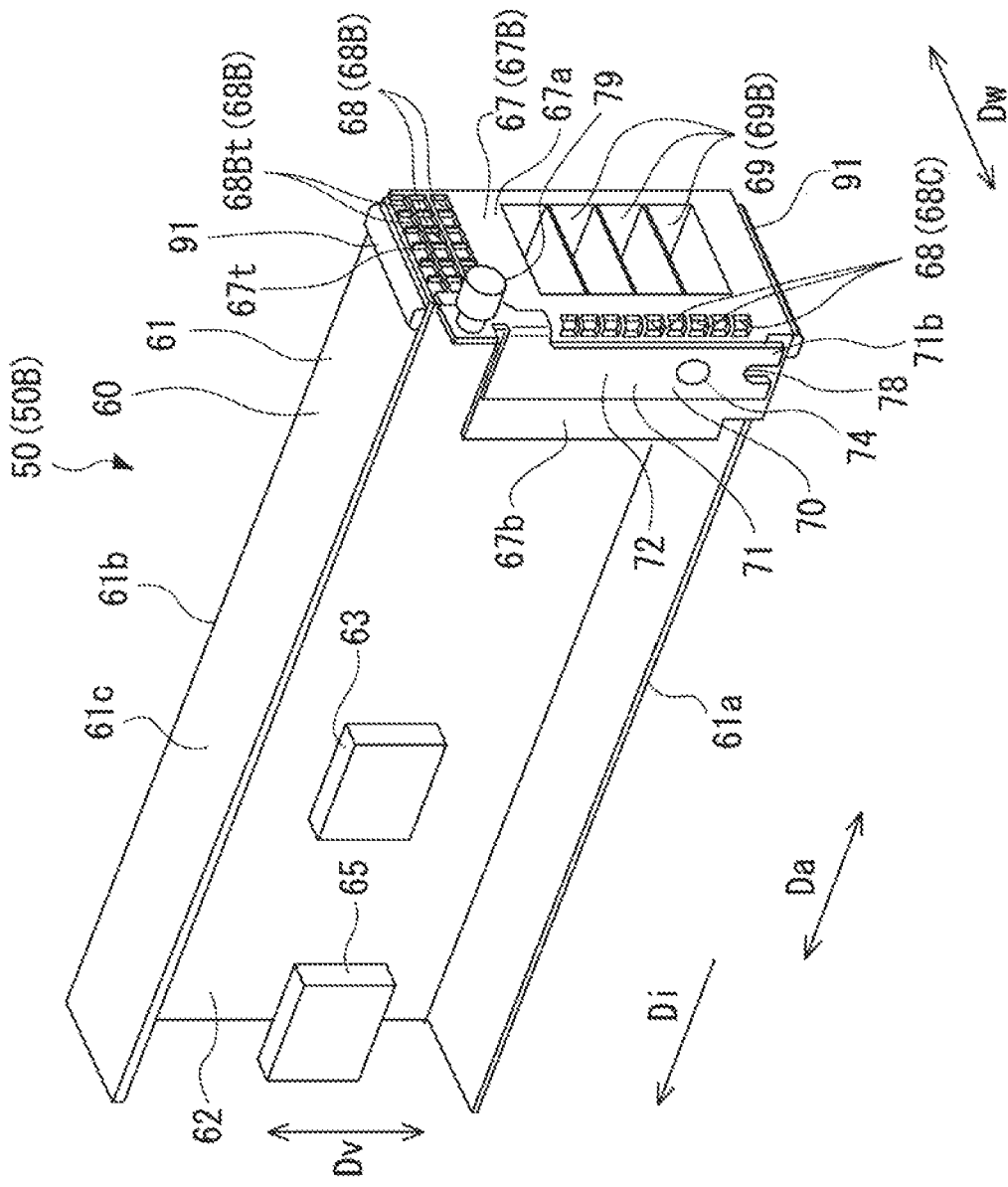
FIG. 9 is a perspective view illustrating another type of electronic component unit constituting the electronic apparatus according to the third embodiment.

FIG. 8 is a perspective view illustrating an electronic component unit constituting the electronic apparatus according to the third embodiment. FIG. 9 is a perspective view illustrating another type of electronic component unit constituting the electronic apparatus according to the third embodiment.

As illustrated in FIGS. 3, 5, 8, and 9, an electronic component unit 50 is provided with a unit body 60, a unit cover 67, and an engaging lever 70.

The unit body 60 is provided so as to be able to be attached and detached with respect to the slot 30. The unit body 60 is provided with a unit housing 61, a circuit board (electronic component) 62, a mounted component (electronic component) 63, and an attachment connector (electronic component) 65.

The unit housing 61 has at least a bottom plate portion 61a. In the present embodiment, the unit housing 61 is provided with a bottom plate portion 61a, a side plate portion 61b, and a top plate portion 61c.

The bottom plate portion 61a is in the form of a flat panel that is rectangular in plan view, with the long sides aligned with the anterior-posterior direction Da. The bottom plate portion 61a is placed on the bottom plate 21 inside each slot 30. The bottom plate portion 61a has a width slightly smaller than the width of the opening of the slot 30 in the width direction Dw. The side plate portion 61b is provided so as to rise upward from one end of the bottom plate portion 61a in the width direction Dw.

The top plate portion 61c is provided parallel to and above the bottom plate portion 61a. The top plate portion 61c is connected to the upper end of the side plate portion 61b. Such a unit housing 61 is substantially C-shaped as viewed in the anterior-posterior direction Da.

A unit housing 61 can slide over the bottom plate 21, in the anterior-posterior direction Da, with respect to each slot 30. The unit housing 61 (unit body 60) is inserted in each slot 30 from one end portion 20a towards the other end portion 20b of the housing 20 in the anterior-posterior direction Da.

In the description below, the direction of insertion of the unit housing 61 (unit body 60) in each slot 30 is referred to as the insertion direction Di.

The circuit board 62 is in the form of a panel arranged in a plane orthogonal to the width direction Dw. The circuit board 62 has a rectangular shape in a side view from the width direction Dw. The circuit board 62 is fixed, so as to be parallel to the side plate portion 61b, between the bottom plate portion 61a and the top plate portion 61c.

The mounted component 63 comprises various types of electric components and the like, and is mounted on the surface of the circuit board 62.

The mounted component 63 may be mounted on just one surface of the circuit board 62, or may be mounted on both surfaces.

In this case, the type, purpose of use, shape, number, and the like of the mounted component 63 mounted on the circuit board 62 are not limited in any way.

The attachment connector 65 is provided on the other side, in the anterior-posterior direction Da (towards the front in the insertion direction Di), of the circuit board 62. In each slot 30, the attachment connector 65 is connected so as to be able to be attached and detached, in the anterior-posterior direction Da, with respect to the receiving connector 28 of the electronic circuit board 27 provided towards the front in the insertion direction Di.

The unit cover 67 is provided on the unit body 60 on the end portion towards the rear in the insertion direction Di. The unit cover 67 is fixed to the unit housing 61 and the circuit board 62 by means of a screw or the like, which is not illustrated. The unit cover 67 has a closing surface portion 67a and a side surface portion 67b.

The closing surface portion 67a is provided within a plane orthogonal to the anterior-posterior direction Da. The closing surface portion 67a closes the opening portion 36 of the slot 30. In the closing surface portion 67a, a screw insertion hole 67h (see FIG. 6) is formed at a position corresponding to the female screw portion 32 of the seat portion 31 provided in the above-mentioned slot 30.

The side surface portion 67b extends in the anterior-posterior direction Da, continuously from one side, in the width direction Dw, of the closing surface portion 67a. The side surface portion 67b is provided on the side of the unit housing 61 opposite to the side plate portion 61b in the width direction Dw.

As illustrated in FIG. 8 and FIG. 9, the unit cover 67 is provided, as needed, with various types of connectors 69 connected to the circuit board 62 so as to be exposed to the rear in the insertion direction Di. The unit cover 67 may be provided with various types of switches, indicator lamps, or the like connected to the circuit board 62.

These connectors 69, switches, indicator lamps (not illustrated), and the like may correspond to functions of the electronic component units 50 defined by the electronic components and the like provided in the unit body 60.

A plurality of first connection openings 68 are formed in the unit cover 67. Each first connection opening 68 is formed so as to penetrate through the closing surface portion 67a in the anterior-posterior direction Da.

Each first connection opening 68 is, for example, square-shaped when viewed from the anterior-posterior direction Da. The first connection openings 68 are not limited to being square-shaped, and for example, may be polygonal, such as hexagonal, circular, elliptical, or the like. Each first connection opening 68 is preferably formed so as to have a defined opening size or less so that a finger or the like cannot be inserted therein.

The engaging lever 70 engages the unit body 60 with the slot 30. The engaging lever 70 is provided with a lever body 71 and a locking member 79.

The lever body 71 has a lever base portion 72 and a lever extension portion 73 integrated thereon.

The lever base portion 72 is in the form of a strip extending in the vertical direction Dv in a plane orthogonal to the width direction Dw. The lever base portion 72 is provided along the side surface portion 67b of the unit cover 67. The lever base portion 72 extends in the vertical direction Dv. The lower end portion of the lever base portion 72 is pivotally connected to the side surface portion 67b by a pivot shaft 74. The pivot shaft 74 is provided lower than the middle portion, in the vertical direction Dv, of the lever base portion 72, at a prescribed distance above the lower end of the lever body 71 (lever base portion 72).

The lever extension portion 73 is provided so as to extend from the upper end portion of the lever base portion 72 towards the inward side of the unit cover 67 in the width direction Dw. The lever extension portion 73 abuts the closing surface portion 67a of the unit cover 67 from the rear side in the insertion direction Di.

A lever engaging groove 78 is provided on the lower end portion 71b, in the vertical direction Dv, of the lever body 71. The lever engaging groove 78 is formed in the shape of a semicircular arc that is indented upward from the lower end of the lever base portion 72. The lever engaging groove 78 engages with an engaging protrusion 38.

The locking member 79 locks the lever body 71 to the housing 20. As illustrated in FIG. 5, the locking member 79 comprises a screw member, and is rotatably supported in a screw holding hole 73h formed in the lever extension portion 73. The locking member 79 is provided at a position on the unit cover 67 corresponding to the screw insertion hole 67h. The locking member 79 can be fastened to the female screw portion 32 provided on the seat portion 31 of the slot 30 through the screw insertion hole 67h in a state in which the lever extension portion 73 is oriented along the closing surface portion 67a of the unit cover 67. As a result thereof, the locking member 79 can lock the lever body 71.

Figure 10:
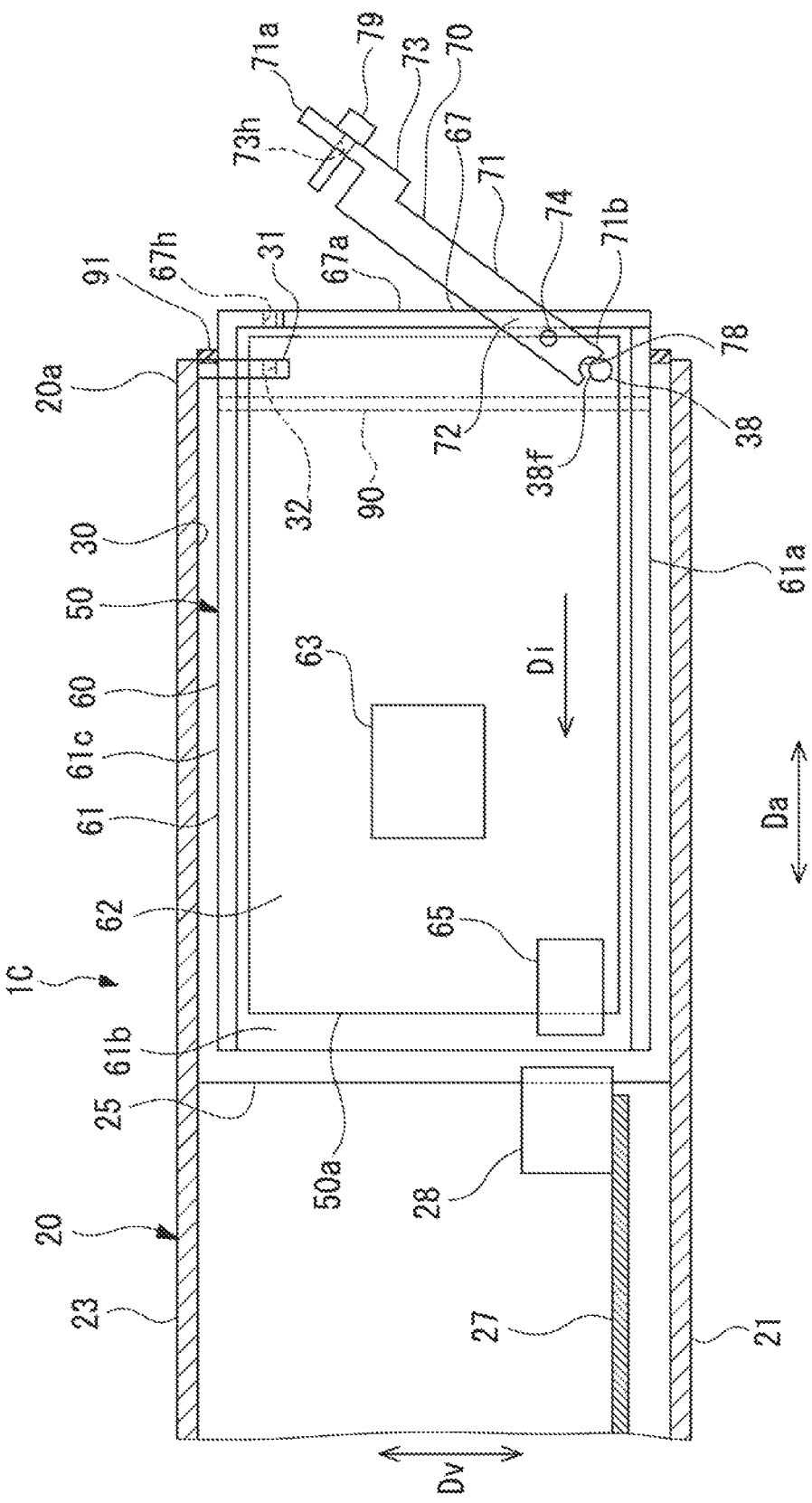
FIG. 10 is a side view illustrating the state of the electronic component unit constituting the electronic apparatus according to the third embodiment when inserted into a slot.

FIG. 10 is a side view illustrating the state of the electronic component unit constituting the electronic apparatus according to the third embodiment when inserted into a slot.

Due to such an engaging lever 70, the electronic component unit 50 as mentioned above can be attached to and detached from the slot 30. As illustrated in FIG. 10, in order to install the electronic component unit 50 in the slot 30, the engaging lever 70 is put in a state of being tilted so that an upper end portion 71a of the lever body 71 protrudes rearward, in the insertion direction Di, with respect to a lower end portion 71b. In this state, the electronic component unit 50 is inserted in the slot 30 from an end portion 50a on the side opposite to the side on which the unit cover 67 and the engaging lever 70 are provided. Then, the lever engaging groove 78 of the lever body 71 abuts the engaging protrusion 38 from the rear in the insertion direction Di. Furthermore, the upper end portion 71a of the lever body 71 is pressed forward in the insertion direction Di. Then, as illustrated in FIG. 6, the lever body 71 pivots about the pivot shaft 74 and the engaging protrusion 38 engages with the lever engaging groove 78. When the lever body 71 continues to be pressed, the unit body 60 is pressed into the slot 30 by the lever body 71 pivoting about the pivot shaft 74 with the lever engaging groove 78 in a state of engagement with the engaging protrusion 38. Then, the attachment connector 65 provided on the circuit board 62 of the electronic component unit 50 is connected to the receiving connector 28 provided in the housing 20.

Thereafter, the locking member 79 is fastened to the female screw portion 32 provided in the seat portion 31 through the screw insertion hole 67h. In this way, the locking member 79 locks the lever body 71.

In order to withdraw the electronic component unit 50 from the slot 30, after the locking member 79 is loosened and unfastened from the female screw portion 32, the upper end portion 71a of the lever body 71 is pulled out in the insertion direction Di, as illustrated in FIG. 10. Then, the lever body 71 pivots about the pivot shaft 74, centered at the engaging protrusion 38. As a result thereof, the attachment connector 65 and the receiving connector 28 are disconnected, and the electronic component unit 50 is pulled out of the slot 30.

Additionally, as illustrated in FIG. 5, FIG. 6, and FIG. 7, in each slot 30, electromagnetic shield members 90 are respectively provided on the partition walls 25 on both sides in the width direction Dw. The electromagnetic shield members 90 extend in the vertical direction Dv between the side surfaces of the unit body 60 and the partition walls 25. On the side of the unit body 60 on which the engaging lever 70 is provided, the electromagnetic shield member 90 is provided in front of the lever body 71 of the engaging lever 70 in the insertion direction Di.

As illustrated in FIG. 5, FIG. 8, and FIG. 9, the upper surface and the lower surface of the unit body 60 are respectively provided with an electromagnetic shield member 91. The electromagnetic shield members 91 respectively extend in the width direction Dw between the lower surface of the unit body 60 and the bottom plate 21, and between the upper surface of the unit body 60 and the upper plate 23.

The electromagnetic shield members 90, 91 comprise sealing materials or the like that block electromagnetic waves and that have electrical conductivity. The electromagnetic shield members 90, 91 keep electromagnetic waves (electromagnetic noise) generated by various types of electronic components in the housing 20 from leaking outside the housing 20 through gaps between the partition walls 25 and the electronic component units 50.

As illustrated in FIG. 5, in the third embodiment, two types of electronic component units 50A, 50B having mutually different functions are installed in two slots 30.

As illustrated in FIG. 4 and FIG. 8, in a unit cover 67A of one electronic component unit 50A, for example, connectors 69A are arranged on the right side of the unit cover 67A in the width direction Dw. A plurality of the connectors 69A are provided so as to be arrayed in the vertical direction Dv.

Additionally, in the one electronic component unit 50A, first connection openings 68A are disposed on the left side of the unit cover 67 in the width direction Dw. The first connection openings 68A are arranged, for example, in two columns in the width direction Dw, each column having eleven arranged in the vertical direction Dv.

As illustrated in FIG. 4 and FIG. 9, in the unit cover 67B of the other electronic component unit 50B, connectors 69B that are wide in the width direction Dw are disposed in the central area, in the width direction Dw, of the unit cover 67B. A plurality of the connectors 69B are provided so as to be arrayed in the vertical direction Dv.

Additionally, in the other electronic component unit 50B, first connection openings 68B, 68C are arranged on the upper portion and on the left side, in the width direction Dw, of the unit cover 67. The first connection openings 68B disposed on the upper portion of the unit cover 67 are arranged in six columns in the width direction Dw, each column having three arranged in the vertical direction Dv. The first connection openings 68Bt located uppermost open so as to straddle the closing surface portion 67a and the upper end surface 67t of the unit cover 67.

The first connection openings 68C disposed on the left side of the unit cover 67 in the width direction Dw include, for example, nine that are arranged in the vertical direction Dv at a corner portion at which the closing surface portion 67a and the side surface portion 67b of the unit cover 67 intersect. Each first connection opening 68B opens so as to straddle the closing surface portion 67a and the side surface portion 67b.

In this case, the total opening area A1 of the plurality of first connection openings 68A formed in the one electronic component unit 50A (number×opening area of each first connection opening 68A) is greater than the total opening area A2 of the plurality of first connection openings 68B and 68C formed in the other electronic component unit 50B (A1>A2).

Thus, two types (multiple types) of electronic component units 50A, 50B having first connection openings 68A, 68B with mutually different total opening areas A1, A2 are incorporated into the electronic apparatus 1C.

As illustrated in FIG. 4, a dummy cover 80 is installed in an opening portion 36 of another slot 30 different from the slots 30 in which the electronic component units 50 (50A, 50B) are accommodated. In other words, the dummy cover 80 is installed in the opening portion 36 of a so-called empty slot, which is a slot 30 not accommodating an electronic component unit 50 (50A, 50B).

Figure 11:
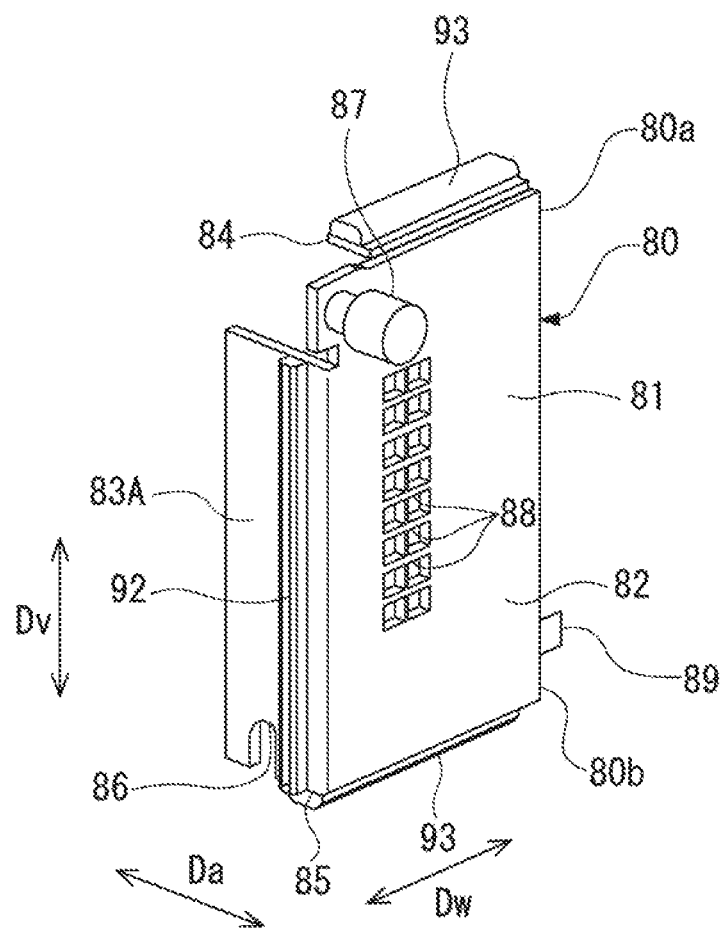
FIG. 11 is a perspective view illustrating a dummy cover of the electronic apparatus according to the third embodiment.
Figure 12:
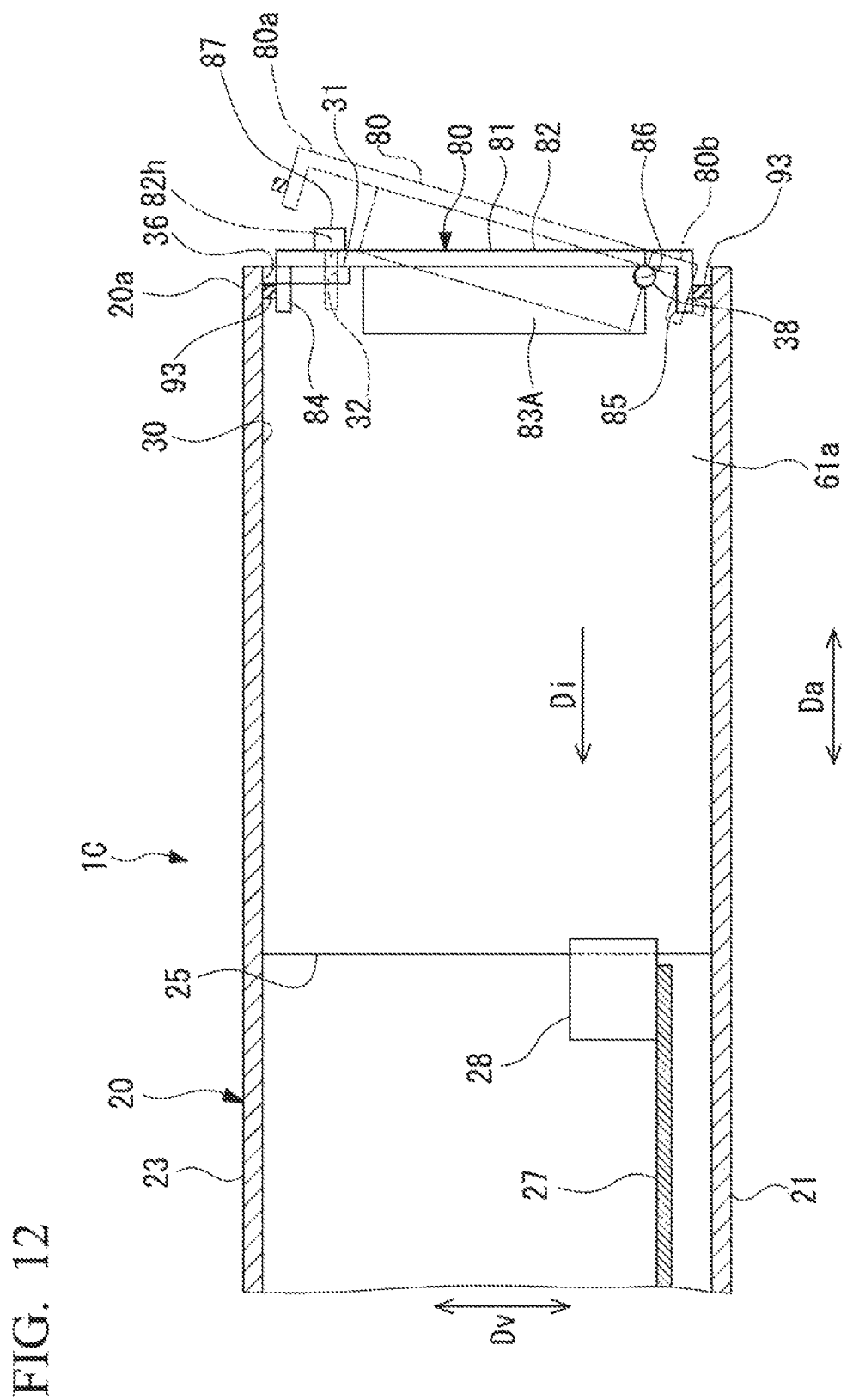
FIG. 12 is a side section view illustrating a slot provided with a dummy cover in the electronic apparatus according to the third embodiment.

FIG. 11 is a perspective view illustrating a dummy cover of the electronic apparatus according to the third embodiment. FIG. 12 is a side section view of a slot provided with a dummy cover in the electronic apparatus according to the third embodiment.

As illustrated in FIG. 4, FIG. 11, and FIG. 12, the dummy cover 80 is provided with a cover body 81 and second connection openings (connection openings) 88.

The cover body 81 has a closing surface portion 82, a pair of side surface portions 83A, 83B, an upper surface portion 84, and a lower surface portion 85.

The closing surface portion 82 is provided in a plane orthogonal to the anterior-posterior direction Da. The closing surface portion 82 closes the opening portion 36 of the slot 30.

The pair of side surface portions 83A, 83B extend, in the anterior-posterior direction Da, continuously from both end portions, in the width direction Dw, of the closing surface portion 82.

The upper surface portion 84 extends, in the anterior-posterior direction Da, continuously from the upper end portion, in the vertical direction Dv, of the closing surface portion 82. The lower surface portion 85 extends, in the anterior-posterior direction Da, continuously from the lower end portion, in the vertical direction Dv, of the closing surface portion 82.

An engaging groove 86 is formed on the side surface portion 83A located on the left side of the closing surface portion 82 in the width direction Dw. The engaging groove 86 is formed at the lower end portion, in the vertical direction Dv, of the side surface portion 83A. The engaging groove 86 is formed in the shape of a semicircular arc that is indented upwards from the lower end of the side surface portion 83A. The engaging groove 86 is the same shape as the lever engaging groove 78 formed in the engaging lever 70. The engaging groove 86 engages with the engaging protrusion 38.

Additionally, a detaining protrusion 89 that protrudes from the closing surface portion 82 in the width direction Dw is formed on the right side of the closing surface portion 82 in the width direction Dw. The detaining protrusion 89 defines the position of the dummy cover 80 in the anterior-posterior direction by abutting the side plate 22 or the partition wall 25 when the dummy cover 80 is installed on the opening portion 36.

The closing surface portion 82 is provided with a screw member 87 on the upper portion on one side in the width direction Dw. The screw member 87 is a component similar to the locking member 79 provided on the engaging lever 70. The screw member 87 is rotatably inserted in a screw holding hole 82h (see FIG. 12) formed in the closing surface portion 82. The screw member 87 is fastened to a female screw portion 32 of the seat portion 31 provided in the slot 30.

Such a dummy cover 80 is able to be attached and detached with respect to the opening portion 36 of the slot 30.

In order to install the dummy cover 80 on the slot 30, as illustrated by the double-dotted chain line in FIG. 12, the dummy cover 80 is put in a state of being tilted so that the upper end portion 80a protrudes rearward, in the insertion direction Di, with respect to the lower end portion 80b. In this state, the dummy cover 80 is inserted into the slot 30, and the engaging groove 86 is engaged with the engaging protrusion 38. In this state, the upper end portion 80a of the dummy cover 80 is pulled forward in the insertion direction Di and put in a vertical state. At this time, the closing surface portion 82 abuts the seat portion 31, and the engaging protrusion 89 abuts the side plate 22 or the partition wall 25. As a result thereof, the opening portion 36 is put in a state of being closed by the dummy cover 80. Then, the screw member 87 is fastened to the female screw portion 32 provided on the seat portion 31. As a result thereof, the dummy cover 80 is installed in the opening portion 36 of the slot 30.

In order to remove the dummy cover 80 from the opening portion 36 in the slot 30, the screw member 87 is loosened and unfastened from the female screw portion 32, after which the upper end portion 80a of the dummy cover 80 is pulled out towards the rear in the insertion direction Di. As a result thereof, the dummy cover 80 pivots about the engaging protrusion 38, and the engaging groove 86 can be separated from the engaging protrusion 38. As a result thereof, the dummy cover 80 can be removed from the opening portion 36 in the slot 30.

On the dummy cover 80, electromagnetic shield members 92 are provided on the pair of side surface portions 83A, 83B. The electromagnetic shield members 92 extend in the vertical direction Dv. The dummy cover 80 is provided with the electromagnetic shield members 93 on the upper surface portion 84 and the lower surface portion 85. The electromagnetic shield members 93 extend in the width direction Dw. These electromagnetic shield members 93, like the electromagnetic shield members 90, 91, comprise sealing materials or the like that block electromagnetic waves and that have electrical conductivity. The electromagnetic shield members 93 keep electromagnetic waves (electromagnetic noise) generated by various types of electronic components in the housing 20 from leaking outside the housing 20 through gaps between the dummy cover 80 and the inner circumferential surface of the slot 30 when the dummy cover 80 is installed in the opening portion 36 of the slot 30.

A plurality of the second connection openings 88 are formed in the closing surface portion 82 of the cover body 81. Each second connection opening 88 is formed so as to penetrate through the closing surface portion 82 in the anterior-posterior direction Da. Each second connection opening 88 is, for example, square-shaped when viewed from the anterior-posterior direction Da. The second connection openings 88 are not limited to being square-shaped, and for example, may be polygonal, such as hexagonal, circular, elliptical, or the like. Each second connection opening 88 is preferably formed so as to have a defined opening size or less so that a finger or the like cannot be inserted therein.

In the third embodiment, the second connection openings 88 are disposed in a central area of the cover body 81 in the width direction Dw. The second connection openings 88 are arranged in two columns in the width direction Dw, each column having nine in the vertical direction Dv. The arrangement, number, total opening area, and the like of the plurality of second connection openings 88 are not limited to those illustrated, and changes may be made as appropriate.

In this case, the total opening area A3 of the plurality of second connection openings 88 provided in the dummy cover 80 is set to have a ratio within a predefined range with respect to the total opening areas A1 and A2 of the second connection openings 88 (68A, 68B) in the electronic component unit 50.

For example, the total opening area A3 of the second connection openings 88 in the dummy cover 80 is preferably smaller than the total opening area A1 of the first connection openings 68A in the electronic component unit 50A in which the total opening area is the largest among the plurality of types of electronic component units 50 (A3<A1).

Additionally, the total opening area A3 of the second connection openings 88 in the dummy cover 80 is preferably larger than the total opening area A2 of the first connection openings 68B in the electronic component unit 50A in which the total opening area is the smallest among the plurality of types of electronic component units 50 (A3>A2).

Additionally, the total opening area A3 of the plurality of second connection openings 88 is preferably set to be within a range of, for example, 50% to 120% relative to the total opening areas A1 and A2 of the first connection openings 68 (68A, 68B).

In this electronic apparatus 1C, electronic component units 50 and dummy covers 80 are installed in a plurality of slots 30 in a housing 20. In a slot 30 in which an electronic component unit 50 is incorporated, the inside and the outside of the slot 30 are connected through the first connection openings 68 in the unit cover 67. In a slot 30 in which a dummy cover 80 is installed, the inside and the outside of the slot 30 are connected through the second connection openings 88.

The housing 20 is provided with fans (not illustrated) for generating cooling air. The cooling air from the fans (not illustrated) flows inside the housing 20 in the direction opposite to the insertion direction Di, and flows into each slot 30. In a slot 30 in which an electronic component unit 50 (50A, 50B) is installed, the heat in the slot 30 is released to the outside of the housing 20 through the first connection openings 68 in the unit cover 67. In a slot 30 in which a dummy cover 80 is installed, the heat in the slot 30 is released to the outside of the housing 20 through the second connection openings 88 installed in the dummy cover 80.

In a slot 30 in which an electronic component unit 50 is installed, the only connection to the outside of the slot 30 is through the first connection openings 68. Thus, the flow resistance increases for the flow of cooling air in the slot 30. By installing a dummy cover 80 in a slot 30 in which an electronic component unit 50 is not installed, the flow resistance can be raised in comparison to the case in which a dummy cover 80 is not installed. Additionally, by forming second connection openings 88 in the dummy cover 80, the flow resistance is suppressed from becoming excessively high. In this way, the pressure balance is improved between slots 30 accommodating electronic component units 50 and other slots 30 on which dummy covers 80 are installed. Thus, the amount of cooling air supplied to slots 30 in which electronic component units 50 are incorporated can be kept from decreasing.

With such an electronic apparatus 1C and a dummy cover 80, the pressure balance can be improved between slots 30 accommodating electronic component units 50 and other slots 30 on which dummy covers 80 having second connection openings 88 are installed. Thus, the amount of cooling air supplied to slots 30 in which electronic component units 50 are incorporated can be kept from decreasing. As a result thereof, the cooling properties of the electronic component units 50 in the housing 20 can be increased.

Additionally, the total opening area A3 of the second connection openings 88 in the dummy cover 80 is set to be a ratio within a predefined range with respect to the total opening areas A1 and A2 of the first connection openings 68 in the unit cover 67.

By setting the total opening area A3 of the second connection openings 88 in the dummy cover 80 to be smaller than the total opening area A1 of the first connection openings 68A having the largest total opening area, the flow resistance (flow resistance) becomes higher in the slots 30 in which the dummy covers 80 are installed. As a result thereof, the cooling properties in the slots 30 in which the electronic component units 50 are incorporated can be efficiently raised. Additionally, by making the total opening area A3 of the second connection openings 88 in the dummy covers 80 larger than the total opening area A2 of the first connection openings 68B having the smallest total opening area, the flow resistance of the slots 30 in which the dummy covers 80 are installed can be suppressed from becoming excessively high. In this way, the pressure balance in the plurality of slots 30 in the electronic apparatus 1C can be made better than that in the dummy cover 80.

Additionally, electromagnetic shield members 92, 93 are provided between the inner circumferential surfaces of the dummy covers 80 and the slots 30. As a result thereof, electromagnetic noise can be efficiently suppressed from leaking to the outside through gaps between the dummy covers 80 and the inner circumferential surfaces of the slots 30.

Modified Example of Third Embodiment

In the abovementioned third embodiment, two types of electronic component units 50A, 50B having mutually different total opening areas A1, A2 were incorporated into the electronic apparatus 1C.

In order to raise the cooling properties of the electronic component units 50 in the slots 30, the total opening area of the first connection openings 68 should preferably be made larger. However, there are cases in which the arrangement, number, total opening area and the like of the first connection openings 68 provided in the respective electronic component units 50 are limited by conditions such as the size, number, arrangement and the like of connectors 69, switches, indicator lamps (not illustrated) and the like provided on the unit covers 67.

The total opening area of the first connection openings 68 in the electronic component units 50 incorporated into the electronic apparatus 1C may be of three or more types, or may be of just one type.

In the case in which the total opening area of the first connection openings 68 among the plurality of types of electronic component units 50 incorporated into the electronic apparatus 1C are the same (approximately the same), the total opening area A3 of the second connection openings 88 in the dummy cover 80 should preferably be equal to or less than the total opening area of the first connection openings 68.

In this way, the flow resistance is raised in the slots 30 in which the dummy covers 80 are installed on the opening portions 36. As a result thereof, the amount of cooling air increases in the plurality of slots 30 in which the electronic component units 50 are incorporated. In this way, the amount of cooling air supplied to the slots 30 in which electronic component units 50 are incorporated can be kept from decreasing. As a result thereof, the cooling properties of the electronic component units 50 in the housing 20 can be increased.

Additionally, the total opening area A3 of the second connection openings 88 in the dummy covers 80 can be changed, as appropriate, in accordance with the total opening area in the electronic component units 50 installed in other slots 30. For example, some of the second connection openings 88 formed in the dummy covers 80 may be covered with lids or the like to adjust the total opening area A3 of the second connection openings 88.

Aside therefrom, features of the above-mentioned embodiments may be freely adopted or rejected, or may be changed, as appropriate, to other features, as long as they do not depart from the spirit of the present invention.

Priority is claimed on Japanese Patent Application No. 2018-211208, filed Nov. 9, 2018, the entire disclosure of which is incorporated herein by reference.

REFERENCE SIGNS LIST 1A, 1B, 1C Electronic apparatus
2, 12, 20 Housing
3, 13 Accommodating portion
4, 14 Electronic component unit
5, 15 Dummy cover
5h Second connection opening
6, 16, 36 Opening portion
7 Unit body
8 Unit cover
8h First connection opening
15a Cover body 15h Connection opening
30 Slot (accommodating portion)
50, 50A, 50B Electronic component unit
60 Unit body
67, 67A, 67B Unit cover
68, 68A, 68B, 68Bt, 68C First connection opening
80 Dummy cover
81 Cover body
88 Second connection opening (connection opening)
92 Electromagnetic shield member
93 Electromagnetic shield member
A1, A2, A3 Total opening area

What is claimed is:

1. An electronic apparatus comprising:
a housing;
at least three accommodating portions, formed in the housing, each accommodating portion having an opening portion that opens towards an outside of the housing;
a first electronic component units comprising: a first type of electronic component, a first unit body accommodated in a first accommodating portion among the at least three accommodating portions, and a first unit cover that is installed on the opening portion of the first accommodating portion and that has a plurality of first connection openings defined within a single layer of the first unit cover and connecting an inside and an outside of the first accommodating portion;
a second electronic component unit comprising: a second type of electronic component different from the first type of electronic component, a second unit body accommodated in a third accommodating portion among the at least three accommodating portions, and a second unit cover that is installed on the opening portion of the third accommodating portion and that has a plurality of third connection openings defined within a single layer of the second unit cover and connecting an inside and an outside of the third accommodating portion; and
a dummy cover that is installed on the opening portion of a second accommodating portion among the at least three accommodating portions, and that has a plurality of second connection openings defined within a single layer of the dummy cover and connecting an inside and an outside of the second accommodating portion,
wherein a total opening area of the second connection openings in the dummy cover is smaller than a total opening area of the first connection openings by a margin not less than 50%, and is larger than a total opening area of the third connection openings by a margin not greater than 120%.

2. The electronic apparatus as claimed in claim 1, wherein an electromagnetic shield member is provided between the dummy cover and an inner circumferential surface of the second accommodating portion.

* * * * *